United States Patent
Wirnitzer et al.

(10) Patent No.: US 8,305,042 B2
(45) Date of Patent: Nov. 6, 2012

(54) ELECTRIC HAND-HELD POWER TOOL WITH A SHUT-OFF DELAY DEVICE

(75) Inventors: Bernd Wirnitzer, Friolzheim (DE);
Rainer Glauning, Aichtal-Groetzingen (DE)

(73) Assignee: Robert Bosch GmbH, Stuttgart (DE)

( * ) Notice: Subject to any disclaimer, the term of this patent is extended or adjusted under 35 U.S.C. 154(b) by 1208 days.

(21) Appl. No.: 11/997,020

(22) PCT Filed: Mar. 27, 2007

(86) PCT No.: PCT/EP2007/052901
§ 371 (c)(1),
(2), (4) Date: Jan. 28, 2008

(87) PCT Pub. No.: WO2007/118768
PCT Pub. Date: Oct. 25, 2007

(65) Prior Publication Data
US 2008/0224666 A1     Sep. 18, 2008

(30) Foreign Application Priority Data
Apr. 11, 2006  (DE) .......................... 10 2006 017 369

(51) Int. Cl.
H02J 7/00 (2006.01)
H02H 3/24 (2006.01)
(52) U.S. Cl. ........... 320/136; 320/132; 320/134; 361/92
(58) Field of Classification Search .......... 320/134–136, 320/132; 361/83, 89, 90, 92
See application file for complete search history.

(56) References Cited

U.S. PATENT DOCUMENTS

| 5,272,380 | A | 12/1993 | Clokie |
| 5,898,293 | A * | 4/1999 | Tamai et al. ................... 320/136 |
| 5,912,544 | A * | 6/1999 | Miyakawa et al. ........... 320/106 |
| 6,924,624 | B2 | 8/2005 | Baur et al. |
| 2003/0137279 | A1* | 7/2003 | Baur et al. ..................... 320/135 |
| 2004/0239293 | A1 | 12/2004 | Mori et al. |
| 2006/0214627 | A1 | 9/2006 | Ito et al. |

FOREIGN PATENT DOCUMENTS

| JP | 2001-339867 | 12/2001 |
| JP | 2003-264008 | 9/2003 |
| JP | 2004-312789 | 11/2004 |
| JP | 2006-198690 | 8/2006 |
| JP | 2006-280043 | 10/2006 |
| JP | 2006-341325 | 12/2006 |
| WO | 97/48577 | 12/1997 |

* cited by examiner

*Primary Examiner* — Richard V Muralidar
(74) *Attorney, Agent, or Firm* — Michael J. Striker

(57) ABSTRACT

The invention relates to a handheld electrical machine tool having at least one electrical drive, at least one electrical device requiring electrical energy for its operation, a shut-off delay apparatus for the electrical drive and/or the electrical device and having at least one rechargeable battery for the electrical supply to the drive and the electrical device. Provision is made for the handheld electrical machine tool to have an exhaustive discharge protection apparatus (8), which predetermines the delay time (t) of the shut-off delay apparatus (3) as a function of the state of charge of the rechargeable battery (9) detected by it. In addition, the invention relates to a corresponding method.

15 Claims, 2 Drawing Sheets

ELECTRIC HAND-HELD POWER TOOL WITH A SHUT-OFF DELAY DEVICE

The present invention relates to an electric hand-held power tool with at least one electrical drive, at least one electrical device that requires electrical energy in order to operate, a shut-off delay device for the electrical drive and/or the electrical device, and with at least one rechargeable battery for supplying electrical energy to the drive and the electrical device.

RELATED ART

An electric hand-held power tool of this type is known. In that case, the rechargeable battery is disconnected entirely from all electrical consumers in the electric hand-held power tool when the electric hand-held power tool is switched off, e.g., when a related pushbutton is released. This usually takes place immediately with the electrical drive of the electric hand-held power tool, since an extended after-running time of the tool driven by the electrical drive is undesirable. A delayed shut-off is desirable for other electrical devices, however. These electrical devices are, e.g., additional measurement or testing devices, or the control electronics of the electric hand-held power tool itself. While the electrical components that consume a great deal of current during operation are usually shut off immediately, it is possible and reasonable to allow delayed shut-off of electrical devices that do not consume much current (e.g., the control electronics). Since the control electronics require a short amount of time in order to become fully operational, when the electric hand-held power tool is switched back on after the control electronics have been switched off, a brief dead time occurs until the control electronics respond to the operator's switch-on request. This is not user-friendly and, with hand-guided electric power tools in particular, may result in malfunctions, since the electrical drive starts at a later point in time than the operator expects it to. With the delayed shut-off of the control electronics, dead times can be prevented when the power tool is restarted within the delay time. Since electrical devices require electrical energy—even if only a small amount—in order to operate, with electric hand-held power tools powered by rechargeable batteries, this may result in the rechargeable battery becoming discharged. If an exhaustive-discharge range of the rechargeable battery is reached as a result, the rechargeable battery may become damaged as a result.

TECHNICAL OBJECT

The technical object is to prevent exhaustive discharge of the rechargeable battery despite a delayed shut-off of at least one electrical device.

TECHNICAL SOLUTION

To attain this technical object, it is provided that the electric hand-held power tool includes an exhaustive-discharge safeguard device, which specifies the delay time of the shut-off delay device as a function of the state of charge of the rechargeable battery it has determined. Via an exhaustive-discharge safeguard device of this type, the period of time during which electrical energy is discharged from the rechargeable battery is limited by the state of charge of the rechargeable battery itself. The rechargeable battery may therefore be discharged further by the electrical device only to a magnitude that depends on the state of charge of the rechargeable battery.

ADVANTAGEOUS EFFECTS

According to a refinement of the present invention, the shut-off delay device includes the exhaustive-discharge safeguard device. This reduces the number of components required.

It is provided, in particular, that the exhaustive-discharge safeguard device specifies a shorter delay time of the shut-off delay device when the rechargeable battery has a lower state of charge. The lower the state of charge is, the lower the amount of energy is that the rechargeable battery may discharge in order to avoid entering an exhaustive-discharge range, which could result in damage to the rechargeable battery.

It is also provided that the shut-off delay device does not provide a shut-off delay when the state of charge of the rechargeable battery is below a critical charge threshold. If the state of charge of the rechargeable battery has fallen below a critical charge threshold, the electrical device is also shut off without a time delay. This action prevents the rechargeable battery from becoming discharged further.

The present invention also relates to the operation of an electric hand-held power tool with at least one electrical drive, at least one electrical device that requires electrical energy in order to operate, a shut-off delay device for the electrical drive and/or the electrical device, and with at least one rechargeable battery for supplying electrical energy to the drive and the electrical device. It is provided that an exhaustive-discharge safeguard device of the electric hand-held power tool detects the state of charge of the rechargeable battery and, as a function of this state of charge, specifies a delay time with which the electrical device is shut off with delay by the shut-off delay device. Via a method of this type, the period of time during which electrical energy is discharged from the rechargeable battery is limited by the state of charge of the rechargeable battery itself.

According to a refinement of the present invention, it is provided that the exhaustive-discharge safeguard device specifies a shorter delay time of the shut-off delay device when the rechargeable battery has a lower state of charge. Due to the shorter delay time, the electrical device draws electrical energy from the rechargeable battery for a shorter period of time, thereby ensuring that the rechargeable battery is discharged to a lesser extent.

It is also provided that the shut-off delay device shuts off the electrical device without a shut-off delay when the state of charge of the rechargeable battery is below a critical charge threshold. The exhaustive-discharge safeguard device may specify a delay time equal to zero seconds, or the shut-off delay device itself may shut off without delay.

It is provided, in particular, that the delay time is limited to predetermined values. These values may be, e.g., whole-number multiples of a specified time interval.

According to a refinement of the present invention, the exhaustive-discharge safeguard device specifies the delay time with the state of charge of the rechargeable battery in a continually-modified manner until the critical charge threshold is reached. With a continually modified specification of the delay time, the shut-off delay device may adapt the shut-off delay to the state of charge in a continual manner.

As an alternative, it is provided that the exhaustive-discharge safeguard device specifies the delay time with the state of charge of the rechargeable battery in a stepwise-modified manner.

According to a refinement of the present invention, it is provided that the exhaustive-discharge safeguard device determines the state of charge of the rechargeable battery by measuring the voltage of the rechargeable battery. The voltage of the rechargeable battery is a quantity that changes markedly with the state of charge when the rechargeable battery is discharged or partially discharged. In this range of charge, the voltage of the rechargeable battery provides clear indications of the state of charge of the rechargeable battery. If the rechargeable battery is composed of lithium ion cells, the voltage of the rechargeable battery drops off at an increasing rate as the state of charge decreases. With a very deeply discharged rechargeable battery of this type, an extreme decline in the voltage of the rechargeable battery is observed even when a small amount of current is drawn, e.g., by the electrical device.

According to a refinement of the present invention, the voltage of the rechargeable battery is measured together with a related current under electrical load. If the voltage of the rechargeable battery is measured continually or in time intervals during operation, it is loaded by electrical consumers, e.g., the electrical drive. In order to infer the state of charge of the rechargeable battery, the voltage of the rechargeable battery must be measured together with the related current. When the characteristic curve of the rechargeable battery is known, this measurement may be used to infer the open-circuit voltage of the rechargeable battery and/or the state of charge.

As an alternative or in addition thereto, it is provided that the voltage of the rechargeable battery is measured in a nearly currentless manner. When the voltage of the rechargeable battery is measured, e.g., after the electrical drive and all other components with high current consumption are switched off, the open circuit voltage of the rechargeable battery may be measured in a nearly currentless manner.

According to a refinement of the present invention, the exhaustive-discharge safeguard device allows the electrical drive to be switched on only when the state of charge of the rechargeable battery is above a drive switch-on charge threshold. To this end, the drive switch-on charge threshold is selected such that the state of charge of the rechargeable battery may ensure operation of the electric hand-held power tool over a certain period of time that corresponds to the use of the electric hand-held power tool.

It is also provided that the exhaustive-discharge safeguard device allows the electrical device to be switched on only when the state of charge of the rechargeable battery is above a device switch-on charge threshold. This action prevents the rechargeable battery from becoming discharged further by the electrical device being switched back on. The device switch-on charge threshold is markedly lower, in particular, than the drive switch-on charge threshold, since the electrical consumption of the electrical device is lower than that of the electrical drive.

BRIEF DESCRIPTION OF THE DRAWING

The drawing serves to explain the present invention, with reference to an exemplary embodiments.

Figure 1:
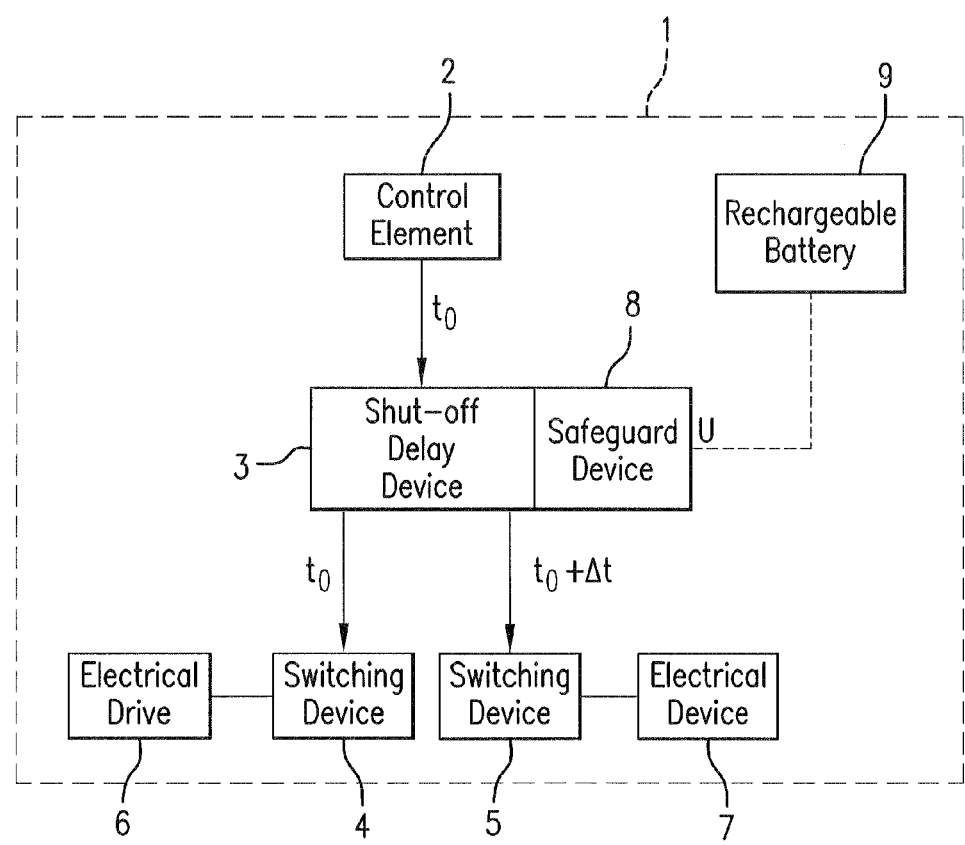
FIG. 1 shows a schematic depiction of an electric hand-held power tool with a shut-off delay device.

The basic structure of an electric hand-held power tool powered by a rechargeable battery is shown in FIG. 1. Only those components that are essential for switching electric hand-held power tool 1 on and off are shown. A control element 2 is operatively connected with a shut-off delay device 3, both of which act on an electrical drive 6 and an electrical device 7 of electric hand-held power tool 1 via switching devices 4, 5. Electrical switching device 4 is assigned to electrical drive 6, and switching device 5 is assigned to electrical device 7. Electric hand-held power tool 1 also includes an exhaustive-discharge safeguard device 8, which is part of shut-off delay device 3 in this exemplary embodiment. The electrical components of electric hand-held power tool 1, in particular electrical device 7 and electrical drive 6, are supplied with electrical energy via a rechargeable battery 9. The supply lines are not shown. Electrical device 7 is, e.g., control electronics of electric hand-held power tool 1. Control element 2 may be designed, e.g., as a pushbutton of a locking key switch. Switching devices 4, 5 may also be part of shut-off delay device 3. As an alternative, switching devices 4, 5 may also be operatively connected directly with the control element. This is often the case with switching devices 4 assigned to electrical drive 6, to ensure that the drive (and, therefore, the tool) stops as quickly as possible.

The following function of electric hand-held power tool 1 with shut-off delay device 3 therefore results: When an operator actuates control element 2 to shut off electric hand-held power tool 1 during operation, control element 2 of shut-off delay device 3 specifies a shut-off time $t_0$ for shutting off electric hand-held power tool 1. The state of charge of rechargeable battery 8 is determined using a not-shown measurement device, and a related signal is sent to exhaustive-discharge safeguard device 8. Exhaustive-discharge safeguard device 8 specifies a delay time $\Delta t$ for a delayed shut off of electrical device 7 as a function of the state of charge of rechargeable battery 9 of shut-off delay device 3. In this exemplary embodiment, no delay time $\Delta t$ is provided for shutting off electrical drive 6. Shut-off delay device 3 therefore shuts off electrical drive 6 at time $t_0$. In this context, to "shut off" means to disconnect the electrical consumer (electrical drive 6 in this case) completely from rechargeable battery 9. To shut off electrical device 7, shut-off delay device 3 takes into account delay time $\Delta t$ specified by exhaustive-discharge safeguard device 8, and shuts off electrical device 7 at time $t_0+\Delta t$. After control element 2 is actuated, electrical drive 6 is shut off immediately, and electrical device 7 is shut off after delay time $\Delta t$. The state of charge of rechargeable battery 9 is determined in this example by measuring voltage U of rechargeable battery. Voltage U may also serve as the input value for exhaustive-discharge safeguard device 8.

Figure 2:
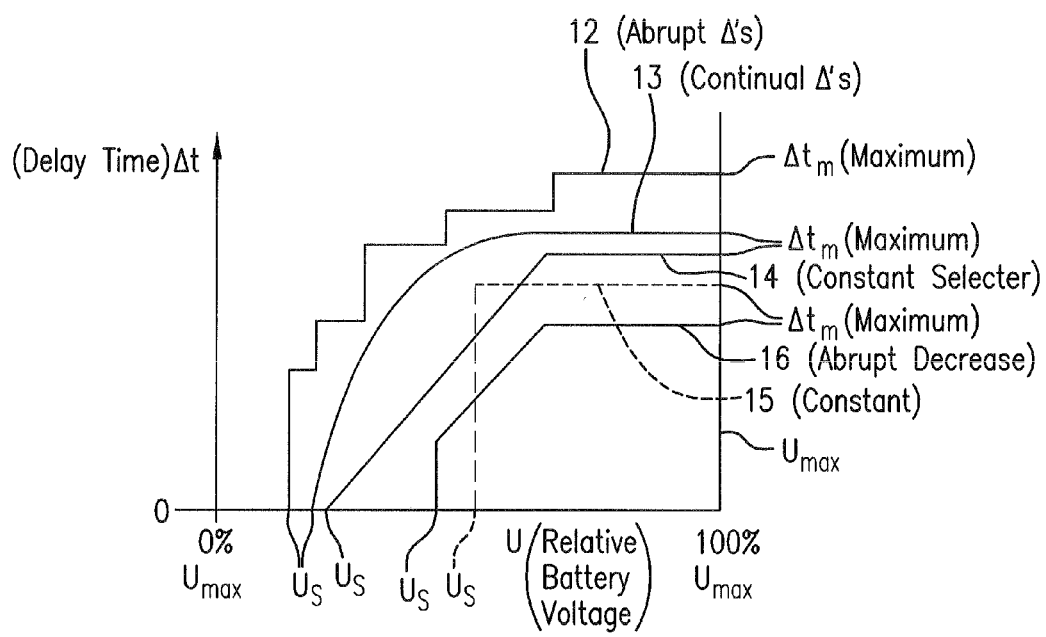
FIG. 2 shows a diagram with possible dependencies of the delay time on the voltage of the rechargeable battery.

FIG. 2 shows a diagram in which delay time $\Delta t$ is plotted on the y-axis against relative rechargeable battery voltage $U/U_{max}$ on the x-axis. The value 100% $U_{max}$ corresponds to the maximum voltage of rechargeable battery 9 when it is fully charged. Rechargeable battery voltage U is a measure of the state of charge of rechargeable battery 9. Several possible interrelationships between rechargeable battery voltage U and delay time $\Delta t$ for various applications are shown as examples in the diagram in FIG. 2. This figure shows qualitative graphs 12, 13, 14, 15, 16 (curves) of the relationship between delay time $\Delta t$ and voltage U specified by exhaustive-discharge safeguard device 8. Particular voltage thresholds $U_S$ represent critical charge thresholds at which delay time $\Delta t$ has dropped to zero. They are shown in a range of, e.g., 15% to 50% of $U_{max}$ as an example. Voltage thresholds $U_S$ in FIG. 2 are selected to be so low and different from each other in order to ensure that the qualitative curve shapes may be distinguished as easily as possible above voltage thresholds $U_S$. Voltage thresholds $U_S$ used at this time are located at higher values than those shown in FIG. 2. The y-axis value of intersection points $\Delta t_m$ of curves 12, 13, 14, 15, 16 with line $U_{max}$ indicates the maximum delay time for particular curve 12, 13, 14, 15, 16. Each curve 12, 13, 14, 15, 16 has a constant delay time of $\Delta t=0$ at values of rechargeable battery voltage U that are lower than particular voltage threshold $U_S$. Under all circumstances with rechargeable battery voltage U, electrical device 7 is shut off without delay below related voltage threshold $U_S$. For this reason, only the regions of curves 12, 13, 14, 15, 16 at which rechargeable battery voltages U are located above particular voltage threshold $U_S$ will be discussed below.

Stepped graph 12 shows an abrupt change in delay time Δt when rechargeable battery voltage U changes. Preset delay time values are assigned to individual voltage ranges. Curve 13 shows a continual change in delay time Δt versus relative rechargeable battery voltage $U/U_{max}$. Curve 14 shows—in a range of 100% to 65% of maximum rechargeable battery voltage $U_{max}$—a constantly-selected delay time Δt, which corresponds to maximum delay time $\Delta t_m$. In a voltage range of 65% to 20% of maximum rechargeable battery voltage $U_{max}$, curve 14 decreases linearly with rechargeable battery voltage U, to Δt=0 at point $U_S$. Curve 15 is shown as a dashed line. In a voltage range of 100% to 50%, it shows a constant delay time Δt, which drops abruptly at 50% to a delay time of Δt=0. Curve 16 shows—in a voltage range of 100% to 65%—a constant delay time Δt, which corresponds to maximum delay time $\Delta t_m$. In a rechargeable battery voltage range of 65% to 40%, curve 16 decreases linearly and abruptly with rechargeable battery voltage U, to Δt=0 at 40% of maximum rechargeable battery voltage.

In addition to specifying delay time Δt for shut-off delay device 3, the exhaustive-discharge safeguard device may also specify switch-on charge thresholds for switching individual components—e.g., electrical drive 6 and electrical device 7—of electric hand-held power tool 1 back on. The charge thresholds described (the critical charge threshold and switch-on charge thresholds, and their related voltage thresholds) are not necessarily influenced in a fixed manner, but rather depending on at least one basic condition, e.g., a temperature measurement carried out in the immediate vicinity of the rechargeable battery.

What is claimed is:

1. An electric hand-held power tool includes at least one electrical drive, at least one electrical device that requires electrical energy in order to operate, a shut-off delay device (3) for the electrical drive and/or the electrical device, at least one rechargeable battery (9) for supplying electrical energy to the drive and the electrical device, and an exhaustive-discharge safeguard device (8), which specifies a delay time (Δt) of the shut-off delay device (3) as a function of the state of charge of the rechargeable battery (9) it has determined, wherein the exhaustive-discharge safeguard device (8) specifies a shorter delay time (Δt) of the shut-off delay device (3) when the rechargeable battery (9) has a lower state of charge.

2. The electric hand-held power tool as recited in claim 1, wherein the shut-off delay device (3) includes the exhaustive-discharge safeguard device (8).

3. The electric hand-held power tool as recited in claim 1, wherein the shut-off delay device (3) does not provide a shut-off delay when the state of charge of the rechargeable battery (9) is below a critical charge threshold.

4. A method for operating an electric hand-held power tool with at least one electrical drive, at least one electrical device that requires electrical energy in order to operate, a shut-off delay device for the electrical drive and/or the electrical device, at least one rechargeable battery for supplying electrical energy to the drive and the electrical device, and an exhaustive-discharge safeguard device, comprising steps of:

detecting by the exhaustive-discharge safeguard device (8) a state of charge of the rechargeable battery and, specifying by the exhaustive-discharge safeguard device, as a function of this state of charge, a delay time with which the electric device is switched off with delay by the shut-off delay device, wherein the exhaustive-discharge safeguard device specifies a shorter delay time of the shut-off delay device when the rechargeable battery has a lower state of charge.

5. The method as recited in claim 4, wherein the shut-off delay device switches off the electrical device without a shut-off delay when the state of charge of the rechargeable battery is below a critical charge threshold.

6. The method as recited in claim 4, wherein the delay time is restricted to predetermined values.

7. The method as recited in claim 4, wherein the exhaustive-discharge safeguard device specifies the delay time with the state of charge of the rechargeable battery in a continually-modified manner until the critical charge threshold is reached.

8. The method as recited in claim 4, wherein the exhaustive-discharge safeguard device specifies the delay time with the state of charge of the rechargeable battery in a stepwise-modified manner.

9. The method as recited in claim 4, wherein the exhaustive-discharge safeguard device determines the state of charge of the rechargeable battery by measuring the voltage of the rechargeable battery.

10. The method as recited in claim 4, wherein the voltage of the rechargeable battery is measured together with a related current under electrical load.

11. The method as recited in claim 4, wherein the voltage of the rechargeable battery is measured in a nearly currentless manner.

12. The method as recited in claim 4, wherein the exhaustive-discharge safeguard device allows the electrical drive to be switched on only when the state of charge of the rechargeable battery is above a drive switch-on charge threshold.

13. The method as recited in claim 4, wherein the exhaustive-discharge safeguard device allows the electrical device to be switched on only when the state of charge of the rechargeable battery is above a device switch-on charge threshold.

14. An electric hand-held power tool with at least one electrical drive, at least one electrical device that requires electrical energy in order to operate, a shut-off delay device for the electrical drive and/or the electrical device, and with at least one rechargeable battery for supplying electrical energy to the drive and the electrical device, characterized by an exhaustive-discharge safeguard device, which specifies a delay time (Δt) of the shut-off delay device as a function of the state of charge of the rechargeable battery it has determined and specifies a shorter delay time (Δt) of the shut-off delay device when the rechargeable battery has a lower state of charge.

15. A method for operating an electric hand-held power tool with at least one electrical drive, at least one electrical device that requires electrical energy in order to operate, a shut-off delay device for the electrical drive and/or the electrical device, and with at least one rechargeable battery for supplying electrical energy to the drive and the electrical device, wherein an exhaustive-discharge safeguard device of the electric hand-held power tool detects the state of charge of the rechargeable battery and, as a function of this state of charge, specifies a delay time with which the electric device is switched off with delay by the shut-off delay device, wherein a shorter delay time of the shut-off delay device is specified when the rechargeable battery has a lower state of charge.

* * * * *